United States Patent
Joshi et al.

(10) Patent No.: US 9,460,985 B2
(45) Date of Patent: Oct. 4, 2016

(54) COOLING APPARATUSES HAVING A JET ORIFICE SURFACE WITH ALTERNATING VAPOR GUIDE CHANNELS

(71) Applicant: Toyota Motor Engineering & Manufacturing North America, Inc., Erlanger, KY (US)

(72) Inventors: Shailesh N. Joshi, Ann Arbor, MI (US); Joshua Sean Kuhlmann, Sunnyvale, CA (US); Matthew Joseph Rau, Ann Arbor, MI (US); Mayur Prakash Gaikwad, Houghton, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 897 days.

(21) Appl. No.: 13/734,635

(22) Filed: Jan. 4, 2013

(65) Prior Publication Data
US 2014/0190668 A1 Jul. 10, 2014

(51) Int. Cl.
*H01L 23/473* (2006.01)
*H01L 23/427* (2006.01)

(52) U.S. Cl.
CPC ......... *H01L 23/4735* (2013.01); *H01L 23/427* (2013.01); *H01L 2924/0002* (2013.01)

(58) Field of Classification Search
CPC ................ F28D 15/0266; F28D 2015/0216; F28F 9/0265; H01L 23/4735; H01L 23/4736; H05K 7/20309; H05K 7/20345
USPC ............. 165/80.4, 104.21, 104.33, 174, 908; 361/679.46, 679.53, 679.54, 688, 689, 361/698–702
See application file for complete search history.

(56) References Cited

U.S. PATENT DOCUMENTS

| 4,583,582 A | 4/1986 | Grossman |
| 5,067,047 A | 11/1991 | Azar |

(Continued)

FOREIGN PATENT DOCUMENTS

| DE | 102004018144 A1 * | 11/2005 | ......... H01L 23/4735 |
| JP | 10121110 | 5/1998 | |
| WO | 98/44307 | 10/1998 | |
| WO | WO2005029555 | 3/2005 | |

OTHER PUBLICATIONS

Z. Q. Chen et al., "An experimental study of two phase flow and boiling heat transfer in bi-dispersed porous channels," available at http://www.me.ust.hk/~mezhao/pdf/49.PDF.

(Continued)

*Primary Examiner* — Len Tran
*Assistant Examiner* — For K Ling
(74) *Attorney, Agent, or Firm* — Dinsmore & Shohl LLP

(57) ABSTRACT

Jet-impingement, two-phase cooling apparatuses having alternating vapor outlet channels are disclosed. In one embodiment, a cooling apparatus includes a fluid inlet channel, a jet orifice surface, and a target surface. The jet orifice surface includes an array of jet orifices. The jet orifices are arranged in rows. Coolant fluid within the fluid inlet channel flows through the array of jet orifices as impingement jets. The jet orifice surface further includes a plurality of vapor guide channels positioned between the plurality of jet orifice rows and parallel to a first axis such that the jet orifice surface is defined by alternating jet orifice rows and vapor guide channels. The target surface has a plurality of surface fins extending from a surface of the target surface and parallel to a second axis that is orthogonal to the first axis, wherein the jet orifice surface is positioned proximate the surface fins.

16 Claims, 15 Drawing Sheets

(56) References Cited

U.S. PATENT DOCUMENTS

| | | | |
|---|---|---|---|
| 5,070,936 A * | 12/1991 | Carroll | H01L 23/3677 165/185 |
| 5,263,536 A * | 11/1993 | Hulburd | H01S 5/02423 165/104.33 |
| 5,402,004 A | 3/1995 | Ozmat | |
| 5,987,892 A * | 11/1999 | Watanabe | A47G 29/141 62/259.2 |
| 6,123,145 A | 9/2000 | Glezer et al. | |
| 6,366,462 B1 * | 4/2002 | Chu | H01L 23/427 165/80.4 |
| 6,952,346 B2 | 10/2005 | Tilton et al. | |
| 6,986,382 B2 | 1/2006 | Upadhya et al. | |
| 6,988,535 B2 | 1/2006 | Upadhya et al. | |
| 7,277,283 B2 | 10/2007 | Campbell et al. | |
| 7,375,962 B2 | 5/2008 | Campbell et al. | |
| 7,511,957 B2 | 3/2009 | Campbell et al. | |
| 7,530,778 B2 | 5/2009 | Yassour et al. | |
| 7,571,618 B2 | 8/2009 | Dessiatoun | |
| 7,597,135 B2 | 10/2009 | Ghosh et al. | |
| 7,639,030 B2 | 12/2009 | Wadell | |
| 7,762,314 B2 | 7/2010 | Campbell et al. | |
| 7,841,843 B2 | 11/2010 | Cho et al. | |
| 7,885,074 B2 | 2/2011 | Campbell et al. | |
| 7,921,664 B2 | 4/2011 | Rini et al. | |
| 7,942,997 B2 | 5/2011 | Rivas et al. | |
| 7,992,627 B2 | 8/2011 | Bezama et al. | |
| 8,059,405 B2 | 11/2011 | Campbell et al. | |
| 8,074,706 B2 | 12/2011 | Su et al. | |
| 8,077,460 B1 | 12/2011 | Dede et al. | |
| 8,081,461 B2 | 12/2011 | Campbell et al. | |
| 8,118,084 B2 | 2/2012 | Harvey | |
| 8,194,406 B2 | 6/2012 | Campbell et al. | |
| 8,391,008 B2 | 3/2013 | Dede | |
| 2005/0072177 A1 * | 4/2005 | Hale | F28F 13/02 62/310 |
| 2006/0096738 A1 * | 5/2006 | Kang | F28F 3/022 165/80.4 |
| 2006/0250773 A1 * | 11/2006 | Campbell | H01L 23/4735 361/699 |
| 2007/0084587 A1 | 4/2007 | Huang et al. | |
| 2007/0119565 A1 | 5/2007 | Brunschwiler et al. | |
| 2009/0314467 A1 * | 12/2009 | Campbell | H01L 23/4735 165/80.4 |
| 2010/0044018 A1 | 2/2010 | Furberg et al. | |
| 2010/0097760 A1 | 4/2010 | Azar et al. | |
| 2011/0146955 A1 | 6/2011 | Chen | |
| 2011/0272120 A1 | 11/2011 | Joshi et al. | |
| 2012/0097368 A1 | 4/2012 | Chen et al. | |
| 2012/0168145 A1 | 7/2012 | Peterson et al. | |
| 2012/0170222 A1 | 7/2012 | Dede | |
| 2012/0181005 A1 | 7/2012 | Downing | |
| 2012/0212907 A1 | 8/2012 | Dede | |
| 2012/0279684 A1 | 11/2012 | Keisling et al. | |
| 2013/0020059 A1 | 1/2013 | Park | |

OTHER PUBLICATIONS

Palm et al., "Enhancement of Boiling Heat transfer by Application of a Porous Layer," available at: http://www.energy.kth.se/index.asp?pnr=10&ID=125&lang=0.

Zhao, Zenghui, "Enhanced heat transfer with jet impingement on structured-porous surfaces," available at http://ieeexplore.ieee.org/xpl/login.jsp?tp=&arnumber=6231577&url=http%3A%2F%2Fieeexplore.ieee.org%2Fxpls%2Fabs_all.jsp%3Farnumber%3D6231577.

J. P. Li, et al., Porous Ti6Al4V scaffold directly fabricating by rapid prototyping: Preparation and in vitro experiment; Science Direct; Biomaterials 27 (2006) 1223-1235.

U.S. Appl. No. 13/683,660, filed Nov. 21, 2012 entitled "Cooling Apparatuses Having Sloped Vapor Outlet Channels".

Amon, Cristina H., S. C. Yao, C.F. Wu, and C. C. Hsieh. "Microelectromechanical System-Based Evaporative Thermal Management of High Heat Flux Electronics." Journal of Heat Transfer, 2005:66-75.

Brignoni, L., Garimella, S., "Performance Characteristics of Confined Impinging Air Jets with Surface Enhancement," Advances in Electronic Packaging, vol. 26-2, 1999: 2009-2014.

El-Sheikh, H., Garimella, S., "Heat Transfer from Pin-Fin Heat Sinks under Multiple Impinging Jets," IEEE Transactions on Advanced Packaging, vol. 23-1, 2000: 113-120.

http://digitalcommons.mcmaster.ca/cgi/viewcontent.cgi?article=7365&context=opendissertations; "Effect of surface finish on boiling heat transfer at stagnation point under free liquid jet impingement".

http://www.sciencedirect.com/science/article/pii/S0017931098003378; "An experimental study of slot jet impingement cooling on concave surface: effects of nozzle configuration and curvature".

https://engineering.purdue.edu/CTRC/research/projects/A_JetImpingement_oneslider2011.pdf; "Two-Phase Liquid Jet Impingement Cooling"; S. V. Garimella, D.A. West; Purdue University, Cooling Technologies Research Center.

https://www.lboro.ac.uk/research/iemrc/documents/EventsDocuments/3rd%20conference%202008/Presentations/opt%20cooling%20Skuriat%20notts.pdf; "Optimum Cooling Solutions for Power Electronics"; Robert Skuriat, Nottingham University, Jul. 4, 2008.

Lay, J. H., and V.K. Dhir. "Nucleate Boiling Heat Flux Enhancement on Macro/Micro-Structured Surfaces Cooled by an Impinging Jet." Journal of Enhanced Heat Transfer, 1995: 177-88.

Sung, M. K., Mudawar, I., "Single-phase and two-phase cooling using hybrid micro-channel/slot-jet module." Int. J. of Heat and Mass Transfer, 51, 2008: 3825-2839.

Wadsworth, D.C., Mudawar, I., "Cooling of a Multichip Electronic Module by Means of Confined Two-Dimensional jets of dielectric liquid," Transactions of the ASME Journal of Heat Transfer, vol. 112, 1990: 891-898.

http://academiccommons.columbia.edu/catalog/ac%3A131465; "Micro-Evaporator Design and Investigation of Phase Change in Tailored Microchannels"; Selin Arslan: Graduate School of Arts and Sciences, Columbia University, 2011.

Brunschwiler, T., H. Rothuizen, M. Fabbri, U. Kloter, B. Michel, R.J. Benzama, and G. Natarajan. Direct Liquid Jet-Impingement Cooling With Micron-Sized Nozzle Array and Distributed Return Architecture. Proc. of the Tenth Intersociety Conference on Thermal and Thermomechanical Phenomena in Electronics Systems, San Diego, CA, 2006: 196-203.

* cited by examiner

COOLING APPARATUSES HAVING A JET ORIFICE SURFACE WITH ALTERNATING VAPOR GUIDE CHANNELS

TECHNICAL FIELD

The present specification generally relates to cooling apparatuses for cooling heat generating devices and, more particularly, to jet impingement, two-phase cooling apparatuses having alternating vapor guide channels in a jet orifice surface.

BACKGROUND

Heat generating devices, such as power semiconductor devices, may be coupled to a heat spreader to remove heat and lower the maximum operating temperature of the heat generating device. In some applications, cooling fluid may be used to receive heat generated by the heat generating device by convective thermal transfer, and remove such heat from the heat generating device. For example, jet impingement may be used to cool a heat generating device by directing impingement jets of coolant fluid onto the heat generating device or a target surface that is thermally coupled to the heat generating device. Additionally, jet impingement may also be combined with two-phase cooling, where the heat generating device is cooled by the phase change of the coolant fluid from a liquid to a vapor. However, vapor bubbles are typically formed within the coolant fluid near the heat generating device. If not properly evacuated, vapor bubbles can lead to an increase in pressure drop and, if allowed to collect, lead to an increase in pressure within the cooling apparatus. The saturation temperature of the coolant fluid increases with increasing pressure, which adversely affects the performance of the two-phase heat transfer.

Accordingly, a need exists for alternative jet impingement, two-phase cooling apparatuses.

SUMMARY

In one embodiment, a cooling apparatus includes a fluid inlet channel, a jet orifice surface, and a target surface. The jet orifice surface includes an array of jet orifices. The jet orifices are arranged in a plurality of jet orifice rows. Coolant fluid within the fluid inlet channel flows through the array of jet orifices as impingement jets. The jet orifice surface further includes a plurality of vapor guide channels positioned between the plurality of jet orifice rows and parallel to a first axis such that the jet orifice surface is defined by alternating jet orifice rows and vapor guide channels. The target surface has a plurality of surface fins extending from a surface of the target surface and parallel to a second axis that is orthogonal to the first axis, wherein the jet orifice surface is positioned proximate the plurality of surface fins.

In another embodiment, a cooling apparatus includes a jet plate manifold configured to receive a coolant fluid, a jet orifice surface within the jet plate manifold, a vapor manifold, and a target surface coupled to the target surface. The jet orifice surface includes an array of jet orifices having a plurality of jet orifice rows. Coolant fluid within the fluid inlet channel flows through the array of jet orifices as impingement jets. The jet orifice surface further includes a plurality of vapor guide channels positioned between the plurality of jet orifice rows and parallel to a first axis, such that the jet orifice surface is defined by alternating jet orifice rows and vapor guide channels. The jet plate manifold is disposed within an opening of the vapor manifold such that a plurality of vapor outlet channels is located between the jet plate manifold and the vapor manifold. The target surface is coupled to the vapor manifold, wherein at least some of the coolant fluid changes to a vapor that enters the plurality of vapor guide channels of the jet orifice surface.

In yet another embodiment, a cooling apparatus includes an inlet-outlet manifold, a jet plate manifold coupled to the inlet-outlet manifold, a jet orifice plate, a vapor manifold, and a target surface coupled to the vapor manifold. The inlet-outlet manifold includes a fluid inlet configured to receive a coolant fluid, an inlet manifold channel fluidly coupled to the fluid inlet, a plurality of outlet manifold channels, and a fluid outlet fluidly coupled to the plurality of outlet manifold channels. The jet plate manifold includes an upper portion having a plurality of walls, a plurality of slot channels within the plurality of walls, wherein the plurality of slot channels are fluidly coupled to the plurality of outlet manifold channels, a tapered portion extending from the upper portion, a jet plate manifold opening extending through the upper portion and the tapered portion, and a seat within the jet plate manifold opening. The jet plate manifold opening is fluidly coupled to the inlet manifold channel.

The jet orifice plate is disposed within the jet plate manifold opening, and includes a flange portion, a jet orifice surface opposite from the flange portion, and a jet channel. The jet orifice plate is disposed within the jet plate manifold opening such that the flange portion is positioned on the seat. The jet orifice surface includes an array of jet orifices having a plurality of jet orifice rows, and a plurality of vapor guide channels positioned between the plurality of jet orifice rows and parallel to a first axis such that the jet orifice surface is defined by alternating jet orifice rows and vapor guide channels. The jet channel is fluidly coupled to the inlet manifold channel, and the coolant fluid flows through the array of jet orifices as impingement jets. The vapor manifold includes a plurality of tapered walls defining an opening. The tapered portion of the jet plate manifold is disposed within the opening of the vapor manifold such that a plurality of vapor outlet channels are located between the plurality of tapered walls of the vapor manifold and the tapered portion of the jet plate manifold. Each vapor outlet channel of the plurality of vapor outlet channels slopes in a direction that is both away from the jet orifice plate and opposite from a direction of the impingement jets. The target surface is coupled to the vapor manifold, wherein at least some of the coolant fluid changes to a vapor that enters the plurality of vapor guide channels of the jet orifice surface.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of the present disclosure are directed to two-phase, jet impingement cooling apparatuses that may be utilized to cool heat generating devices, such as semiconductor devices. Jet-impingement cooling is provided by directing jets of coolant fluid at an impingement region of a target surface, which may be a heat generating device or a thermally conductive surface coupled to the heat generating device. Heat is transferred to the coolant fluid. In two-phase heat transfer systems, the coolant fluid changes phase from a fluid to a vapor, thereby removing heat flux from the heat generating device. Embodiments described herein guide vapor that is formed at the heat source (e.g., at the semiconductor device) away from the heat source to prevent the build-up of pressure within the cooling apparatus. More particularly, embodiments of the present disclosure include a jet orifice surface having alternating vapor guide channels positioned between rows of jet orifices through which coolant fluid flows as impingement jets. When combined with surface structures, such as surface fins, the vapor guide channels provide additional outlet flow paths and additional volume for the evacuation of vapor bubbles that form near the impingement of the target surface. Accordingly, embodiments provide for enhanced heat transfer with minimal increase to the overall pressure drop of the cooling apparatus by combining the vapor guide channels of the jet orifice surface with surface fins of the target surface. Various embodiments of cooling apparatuses having a jet orifice surface with vapor guide channels are described herein below.

Figure 1:
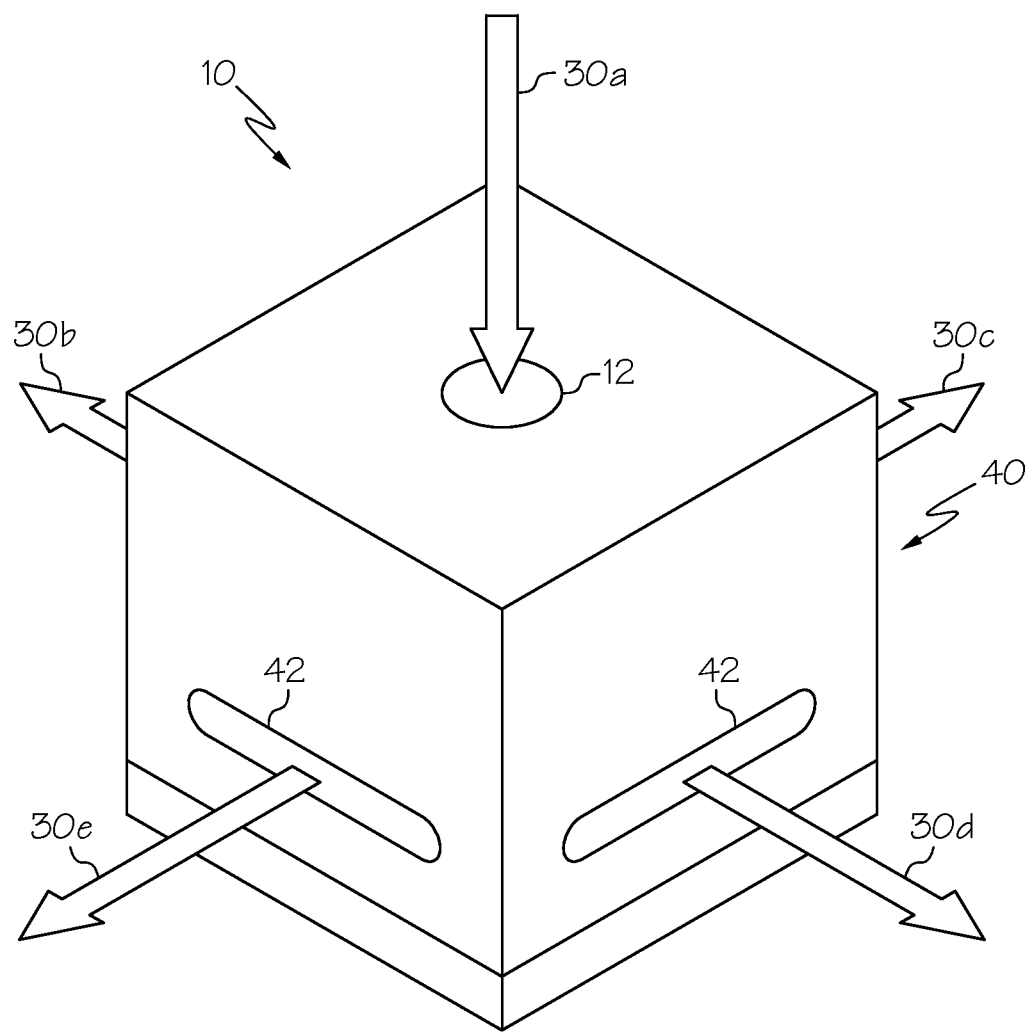
FIG. 1 schematically depicts an exterior, perspective view of a cooling apparatus that depicts a fluid inlet and fluid outlets according to one or more embodiments described and illustrated herein.

Referring now to FIG. 1, an example cooling apparatus 10 is schematically depicted. The cooling apparatus 10 generally comprises a manifold assembly 40 and a target surface 50. In some embodiments, the manifold assembly 40 and the target surface 50 may be configured as a single component. The manifold assembly 40 comprises a fluid inlet 12 configured to receive a coolant fluid, as indicated by arrow 30a. The coolant fluid may be any appropriate liquid, such as deionized water or radiator fluid, for example. As described in more detail below, the coolant fluid strikes the target surface 50 and may exit the cooling apparatus 10 through one or more fluid outlets 42, as indicated by arrows 30b-30e. Although the illustrated cooling apparatus 10 is depicted as having four fluid outlets 42, in other embodiments the cooling apparatus 10 may have only a single outlet (e.g., internal outlet channels within the manifold assembly 40 are coupled to a single outlet). Additionally, in other embodiments, the cooling apparatus 10 may have more than one fluid inlet 12. The fluid inlet 12 and the one or more fluid outlets 42 may be configured as fluid couplings, such as male or female fluid couplings, for connecting fluid lines to the fluid inlet 12 and the fluid outlets 42.

The bottom surface of the target surface 50 is thermally coupled to a heat generating device, such as a semiconductor device (not shown in FIG. 1). Semiconductor devices may include, but are not limited to, insulated gate bipolar transistors (IGBT), metal-oxide-semiconductor field effect transistors (MOSFET), power diodes, power bipolar transistors, and power thyristor devices. As an example and not a limitation, the semiconductor device may be included in a power electronic module as a component in an inverter and/or converter circuit used to electrically power high load devices, such as electric motors in electrified vehicles (e.g., hybrid vehicles, plug-in hybrid electric vehicles, plug-in electric vehicles, and the like).

Figure 2:
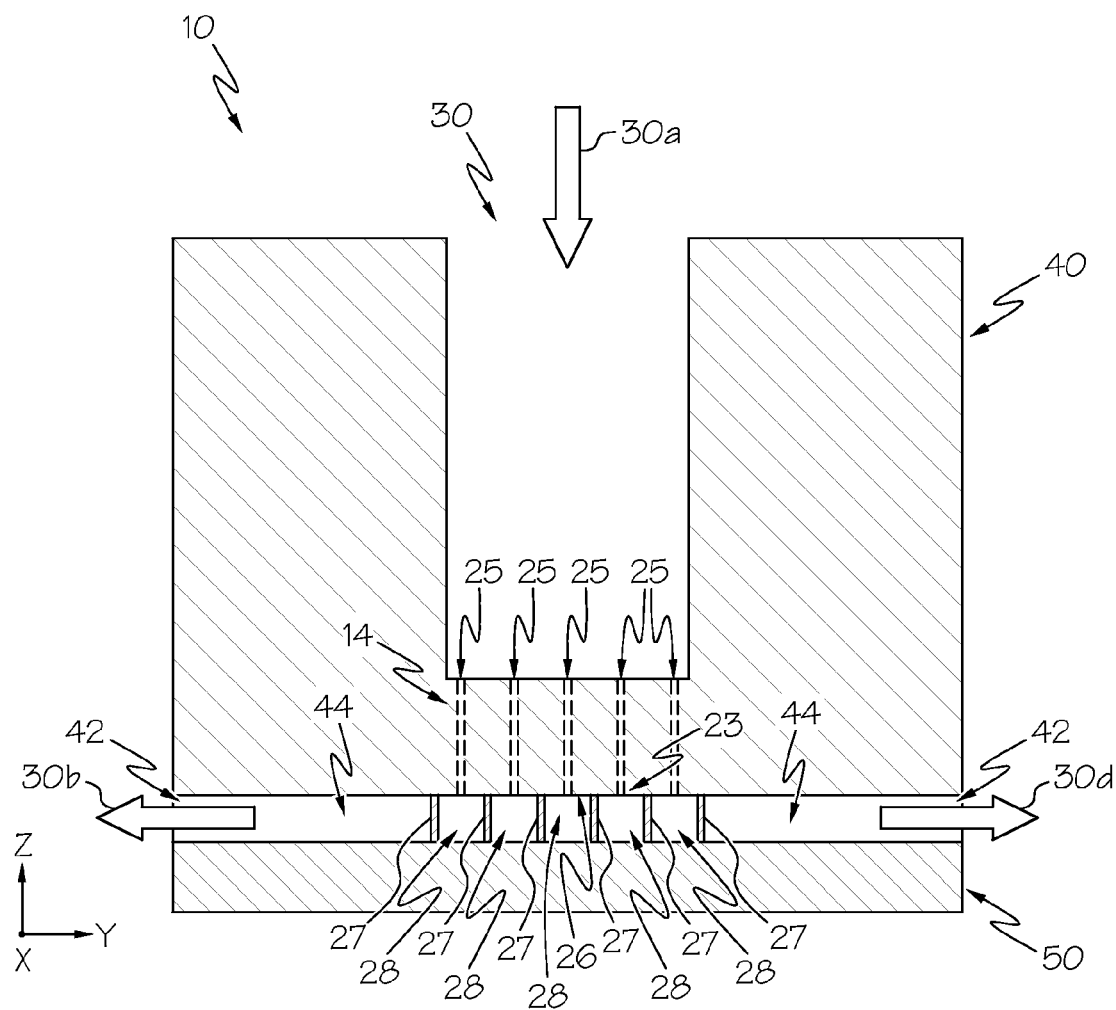
FIG. 2 schematically depicts a cross-sectional view of a cooling apparatus according to one or more embodiments described and illustrated herein.

Referring now to FIG. 2, a cross-sectional, partial side view of a cooling apparatus 10 is schematically depicted. Generally, the cooling apparatus 10 comprises a fluid inlet channel 13 that is fluidly coupled to the fluid inlet 12, a jet orifice surface 26 of a jet orifice plate 14, a target surface 50, a plurality of surface fins 52, and horizontal outlet channels 44. The jet orifice surface 26 contacts, or nearly contacts, the plurality of surface fins 52.

Figure 3:
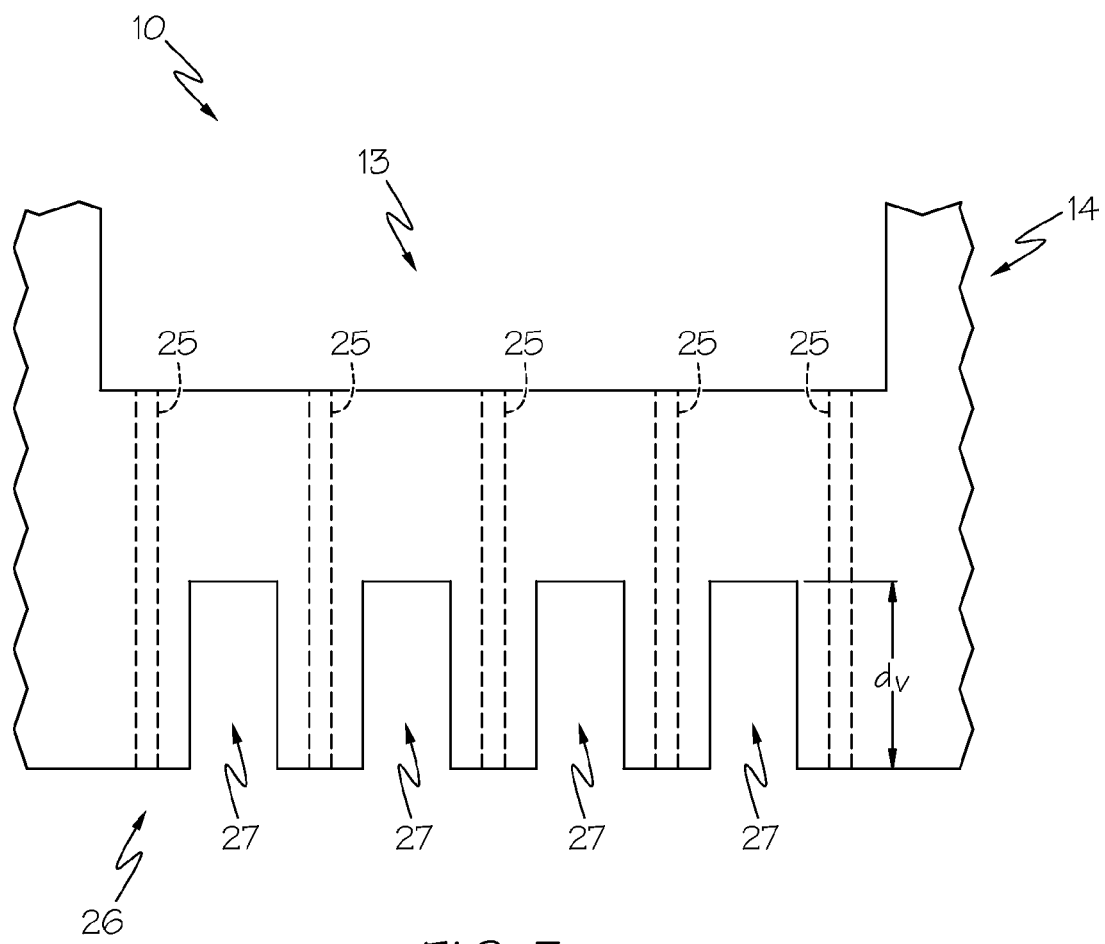
FIG. 3 schematically depicts a jet orifice plate and a jet orifice surface according to one or more embodiments described and illustrated herein.
Figure 4:
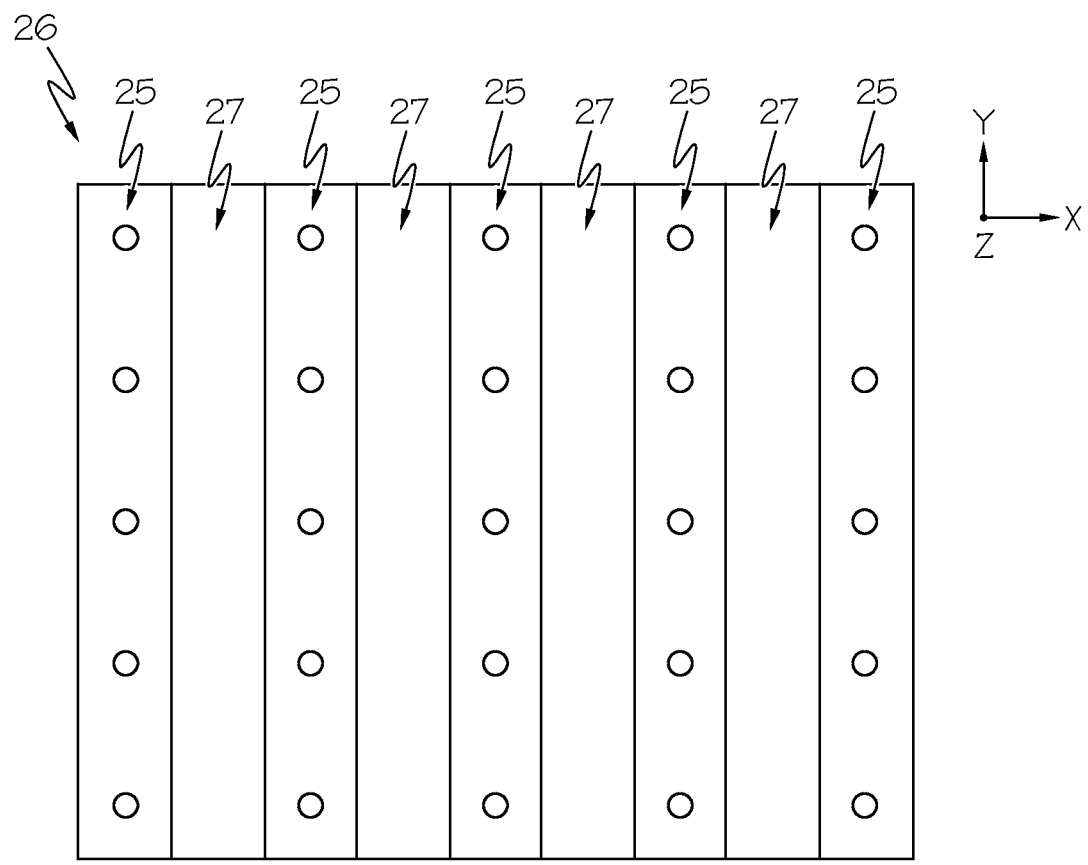
FIG. 4 schematically depicts a jet orifice surface according to one or more embodiments described and illustrated herein.
Figure 5:
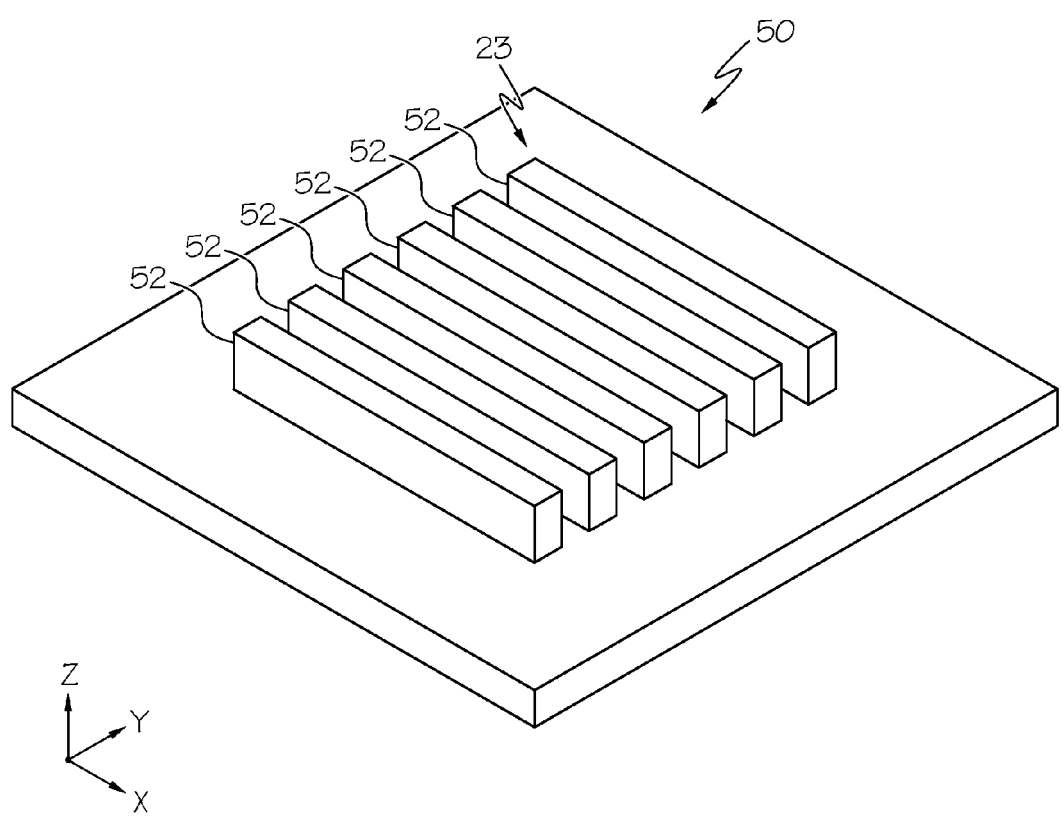
FIG. 5 schematically depicts a top perspective view of a target surface according to one or more embodiments described and illustrated herein.

FIG. 3 is a partial, cross-sectional view of a jet orifice plate 14, while FIG. 4 is a bottom view of a jet orifice surface 26 of the jet orifice plate 14 depicted in FIG. 3. The jet orifice plate 14 comprises an array of jet orifices 25 that extend from the fluid inlet channel 13 to the jet orifice surface 26. As described in more detail below, coolant fluid flows through the fluid inlet channel 13, through the jet orifices 25, and exits the jet orifice plate 14 as impingement jets that impinge the target surface 50. The jet orifices 25 are arranged in a plurality of rows (or columns) that define an array. Vapor guide channels 27 are disposed between the rows of jet orifices 25 such that the jet orifice surface 26 comprises alternating rows of jet orifices 25 and vapor guide channels 27. The vapor guide channels 27 may be formed into the jet orifice plate 14 to a depth $d_v$. As an example and not a limitation, the vapor guide channels 27 may be machined into the jet orifice surface 26. The vapor guide channels 27 provide additional volume for the evacuation of vapor bubbles as they form at the target surface 50, as described below.

Referring now to FIG. 4, an exemplary target surface 50 is schematically depicted. The target surface 50, which may be made of a thermally conductive material (e.g., copper) has a plurality of surface fins 52 that extend from an impingement region 23. The surface fins 52 are arranged in rows. The surface fins 52 may be machined into the target surface 50 or be configured as separate components, for example. The target surface 50 and/or the plurality of surface fins 52 may be roughened or porous to maximize the number of nucleation sites where vapor bubbles may form.

Figure 6:
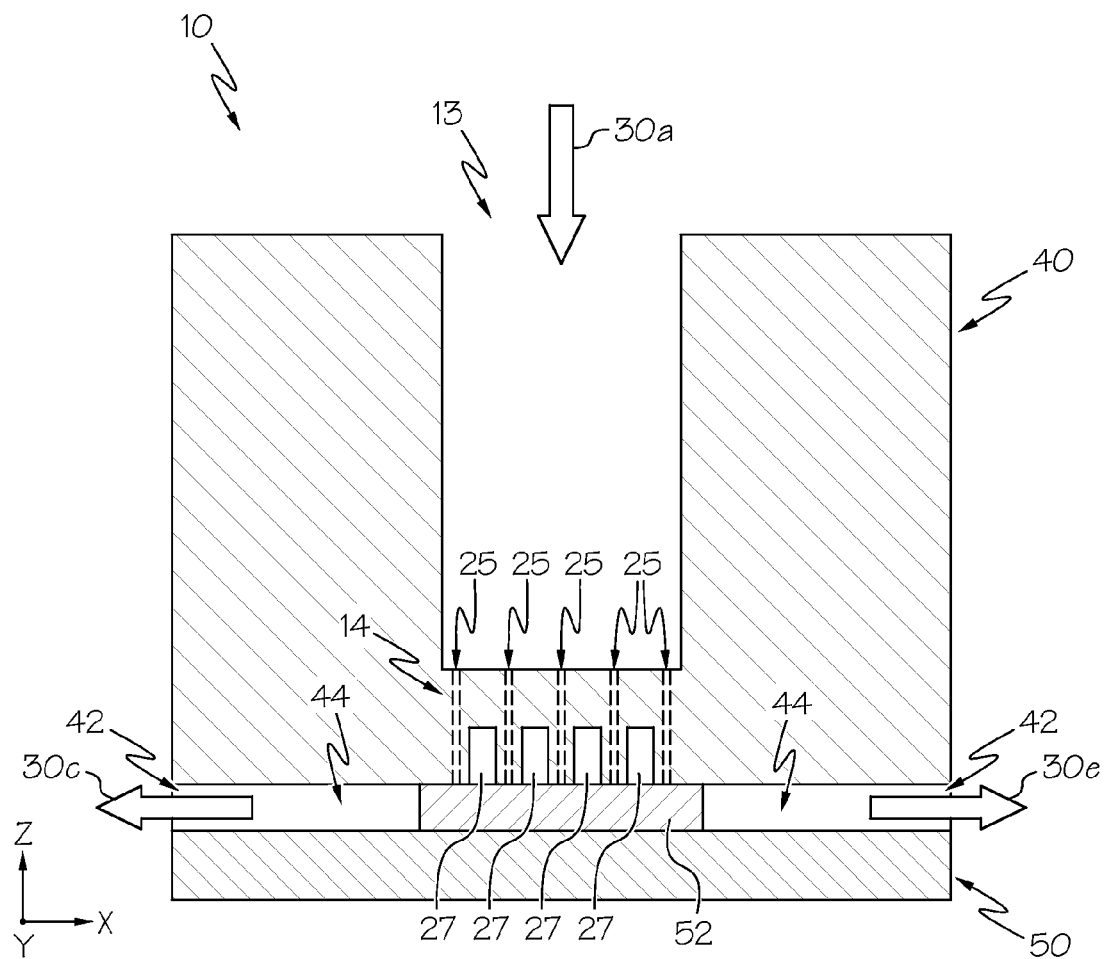
FIG. 6 schematically depicts a cross-sectional view of a cooling apparatus according to one or more embodiments described and illustrated herein.

Referring once again to FIG. 2, the jet orifice surface 26 is positioned with respect to the plurality of surface fins 52 such that jet orifices 25 are offset from the surface fins 52 along the y-axis. Thus, impingement jets that exit the jet orifices 25 strike the target surface in areas 28 between adjacent surface fins 52. As shown in FIG. 6, the jet orifice surface 26 is positioned with respect to the plurality of surface fins 52 such that the vapor guide channels 27 are orthogonal to the surface fins 52. For example, the vapor guide channels 27 are parallel to a first axis (e.g., the y-axis), while the surface fins are parallel to a second axis (e.g., the x-axis) that is orthogonal to the first axis.

Coolant fluid flowing through the fluid inlet channels 13, as indicated by arrow 30a, flows through the array of jet orifices 25 and exits the jet orifice surface 26 as impingement jets positioned between adjacent surface fins 52. The impingement jets strike the target surface 50. Some of the coolant fluid changes phases from a liquid to a vapor due to the high-temperature heat generating device being cooled. This phase change will cause vapor bubbles to form near the impingement region 23 and the heat generating device. Coolant fluid in the form of vapor and liquid flows in directions along the second axis (e.g., the x-axis) in the areas 28 between the surface fins 52 and into horizontal outlet channels 44, as indicated by arrows 30c and 30e in FIG. 6.

Collection of vapor bubbles may cause an increase in pressure drop within the cooling apparatus 10, which may further cause an increase in the saturation temperature of the coolant fluid that diminishes the effectiveness of heat transfer. Body forces from the bulk fluid motion of the coolant fluid alone may not sufficiently remove all the vapor formed within the cooling apparatus 10. In embodiments of the present disclosure, vapor bubbles that form within the cooling apparatus 10 may enter the vapor guide channels 27 above the surface fins 52. Accordingly, the vapor guide channels 27 provide additional volume for the vapor bubbles, and take advantage of vapor bubble buoyancy to effectively channel outflow away from the surface fins 52. Coolant fluid in the form of vapor (as well as liquid) may flow in directions along the first axis (e.g., the y axis) and enter the horizontal outlet channels 44, as indicated by arrows 30b and 30d of FIG. 2. In some embodiments, the coolant fluid exits the cooling apparatus 10 through a single fluid outlet 42 via the horizontal outlet channels 44. In some embodiments, the horizontal outlet channels 44 may define a coolant fluid chamber that is coupled to one or more fluid outlets 42.

As described in detail below with respect to FIGS. 7-13, the outlet channels within the cooling apparatus may be sloped upwardly and away from the surface fins 52 to take advantage of the buoyancy of the vapor bubbles to remove them and the coolant fluid at the top of the cooling apparatus 10.

Figure 7:
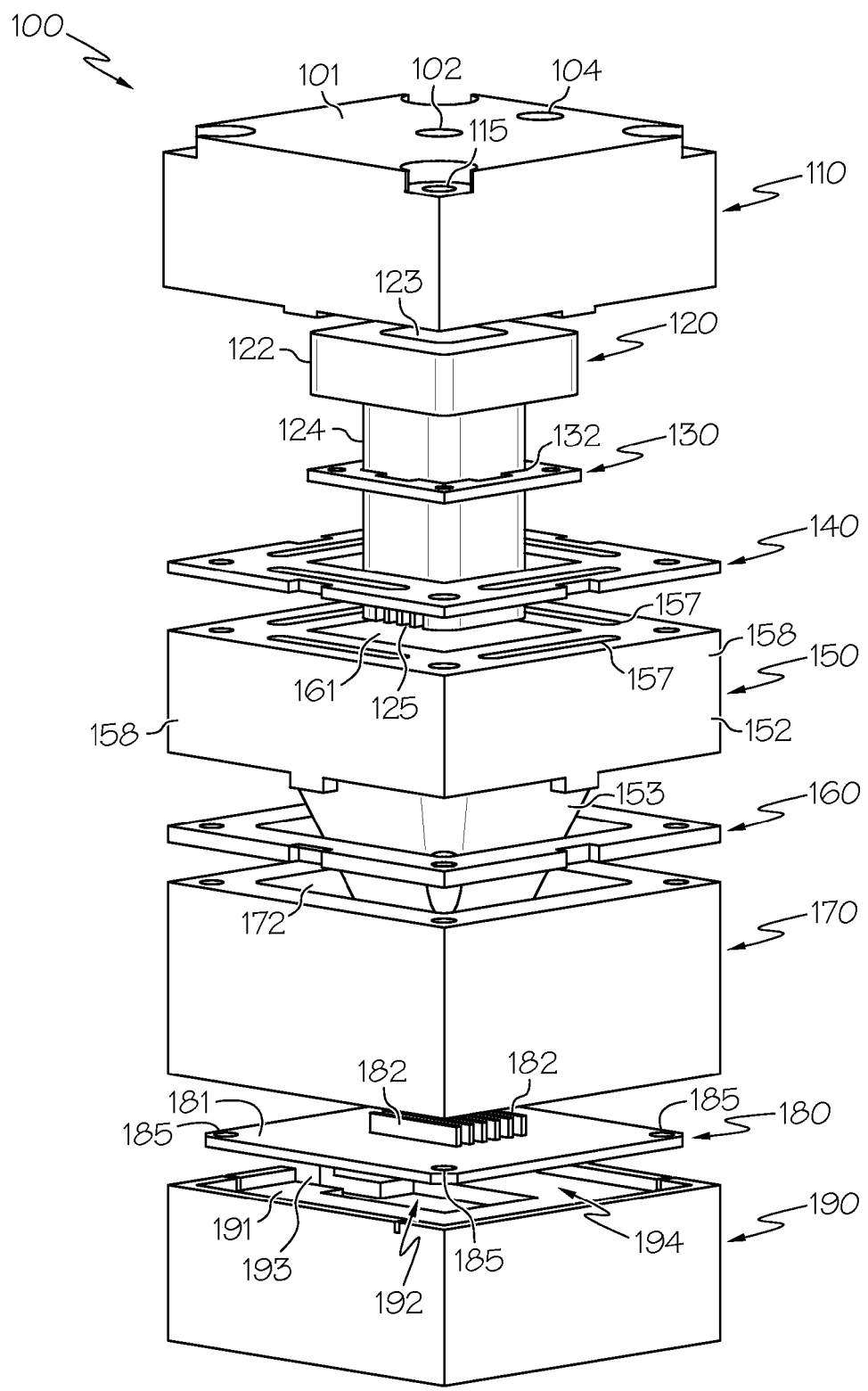
FIG. 7 schematically depicts an exploded view of a cooling apparatus according to one or more embodiments described and illustrated herein.

Referring now to FIG. 7, an examplary cooling apparatus 100 is depicted in an exploded view. Generally, the cooling apparatus comprises an inlet-outlet manifold 110, a jet plate manifold 150 coupled to the inlet-outlet manifold 110, a jet orifice plate 120 disposed within the jet plate manifold 150, a vapor manifold 170 coupled to the jet plate manifold 150, and a target surface 180 disposed within an insulation assembly 190 that is coupled to the vapor manifold 170. Several gaskets may be provided between the various components to prevent fluid from escaping the cooling apparatus 100. For example, a jet plate gasket 130 may be positioned between a flange portion 122 of the jet orifice plate 120 and a seat 131 (see FIG. 12) of the jet plate manifold 150, a jet plate manifold gasket 140 may be positioned between the inlet-outlet manifold 110 and the jet plate manifold 150, and a vapor manifold gasket 160 may be positioned between the jet plate manifold 150 and the vapor manifold 170.

Figure 8:
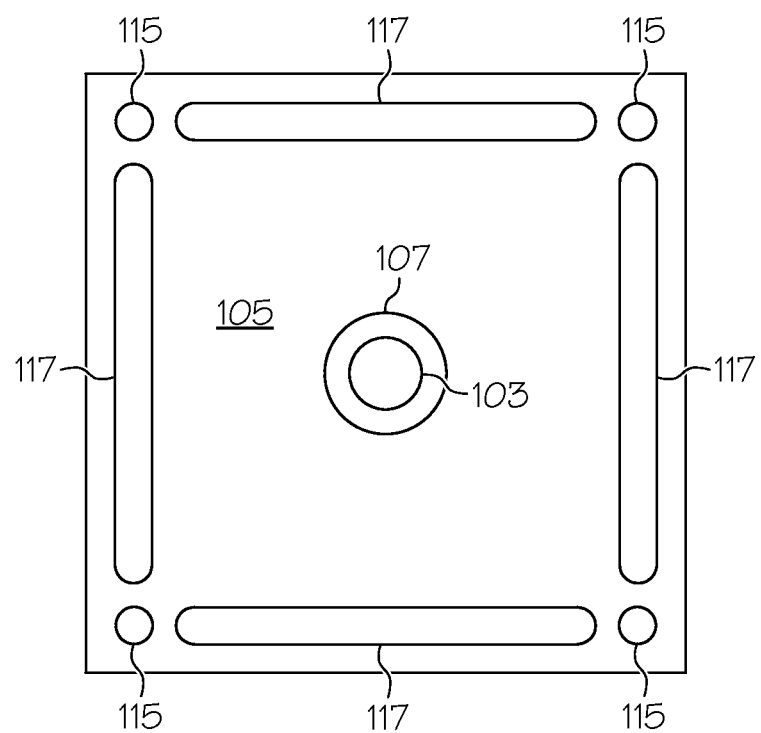
FIG. 8 schematically depicts a bottom view of the inlet-outlet manifold of the cooling apparatus depicted in FIG. 7 according to one or more embodiments described and illustrated herein.

FIG. 8 is a bottom view of the inlet-outlet manifold 110. Referring to FIGS. 7 and 8, the inlet-outlet manifold 110 comprises a fluid inlet 102 at a first surface 101 that is fluidly coupled to an inlet manifold channel 103 within a bulk of the inlet-outlet manifold 110. The inlet manifold channel 103 opens at a second surface 105 of the inlet-outlet manifold 110. In the illustrated body, the inlet manifold channel 103 widens to a larger opening 107 at the second surface 105. A fluid outlet 104 is also present on the first surface 101. The fluid inlet 102 and the fluid outlet 104 may be fluidly coupled to input and output fluid lines, respectively. Coolant fluid is provided to the cooling apparatus 100 through the fluid inlet 102, and is removed from the cooling apparatus 100 through the fluid outlet 104.

Referring to FIG. 8, the second surface 105 of the inlet-outlet manifold 110 also comprises four slot-shaped outlet openings 117 along a perimeter of the inlet-outlet manifold 110. Briefly referring to FIG. 12, each slot-shaped outlet opening 117 is fluidly coupled to an internal outlet manifold channel 114a-114d that is fluidly coupled to the fluid outlet. It is noted that outlet manifold channel 114d is not visible in FIG. 12. The outlet manifold channels 114a-114d are disposed around the inlet manifold channel 103. As described in more detail below, the outlet manifold channels 114a-114d slope upwardly toward the fluid outlet 104 near the first surface 101 of the inlet-outlet manifold 110. Referring once again to FIG. 8, the inlet-outlet manifold 110 further comprises a plurality of through-holes configured to receive a plurality of fasteners (e.g., screws) to maintain the various components of the cooling apparatus 100 in an assembled configuration. It should be understood that, in alternative embodiments, the various components may be coupled together by bonding layers (e.g., solder layers) rather than by mechanical fasteners.

Figure 9A:
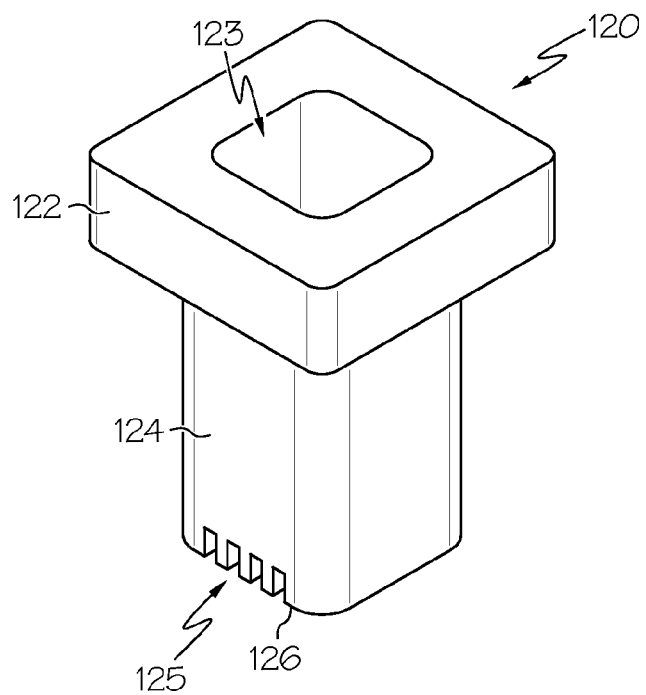
FIG. 9A schematically depicts a perspective view of a jet orifice plate of the cooling apparatus depicted in FIG. 7 according to one or more embodiments described and illustrated herein.
Figure 9B:
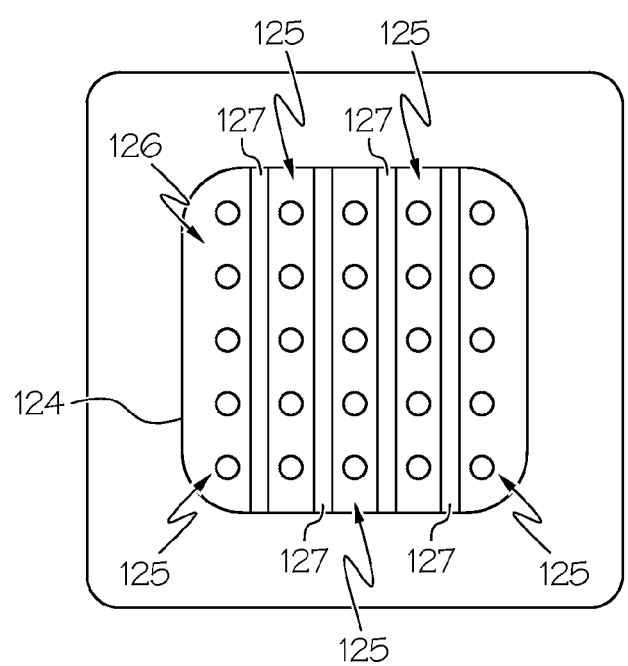
FIG. 9B schematically depicts a bottom view of the jet orifice plate depicted in FIG. 9A.

FIG. 9A schematically depicts a perspective view of an example jet orifice plate 120, while FIG. 9B schematically depicts a bottom view of the jet orifice plate 120 depicted in FIG. 9A. Generally, the illustrated jet orifice plate 120 comprises a flange portion 122, and a narrow portion 124 extending from the flange portion 122. A jet orifice surface 126 is provided on an underside surface of the narrow portion 124. A jet channel extends 123 through the flange portion 122 and the narrow portion 124, and is fluidly coupled to the inlet-outlet manifold 110 to receive input coolant fluid. The jet orifice surface 126 comprises an array of jet orifices 125 through which coolant fluid flows as impingement jets. As shown in FIG. 9B, the array of jet orifices 125 are arranged in rows (or columns). Any number of jet orifices 125 may be provided in any desirable arrangement, and embodiments are not limited to the number and arrangement of jet orifices 125 depicted in FIG. 9B. Vapor guide channels 127 are disposed in the jet orifice surface 126 between the rows of jet orifices 125. Accordingly, the jet orifice surface 126 has alternating rows of the jet orifices 125 and vapor guide channels 127. The vapor guide channels 127 provide additional volume for the evacuation of vapor bubbles as they form within the cooling apparatus 100.

The jet orifice plate 120 is configured to be disposed within the jet plate manifold 150. In some embodiments, the flange portion 122 further includes through-holes configured to receive fasteners that couple the jet orifice plate 120 to the jet plate manifold 150, or one or more through-holes serving as a pressure relief.

Figure 10A:
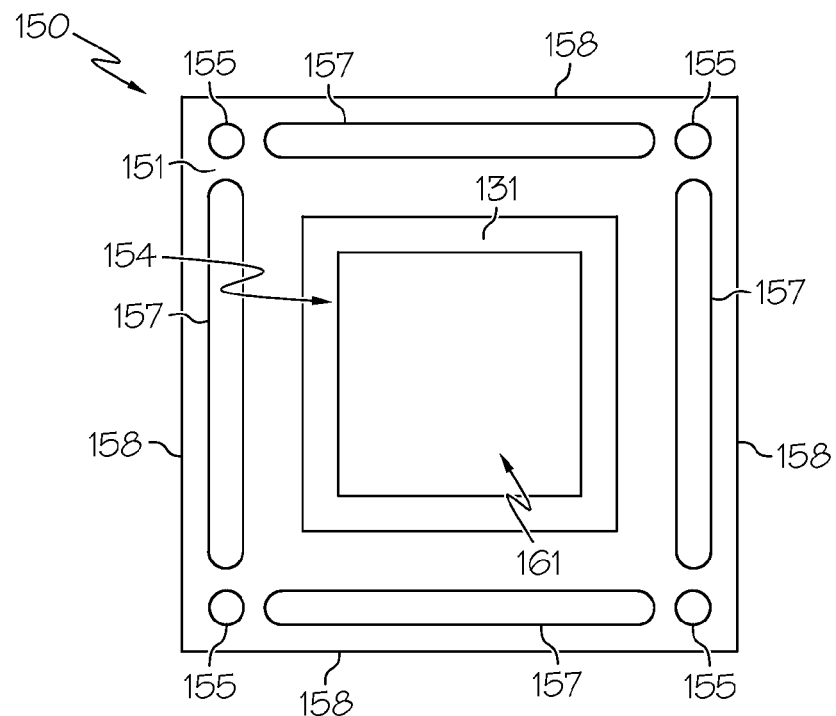
FIG. 10A schematically depicts a top view of the jet plate manifold of the cooling apparatus depicted in FIG. 7 according to one or more embodiments described and illustrated herein.
Figure 10B:
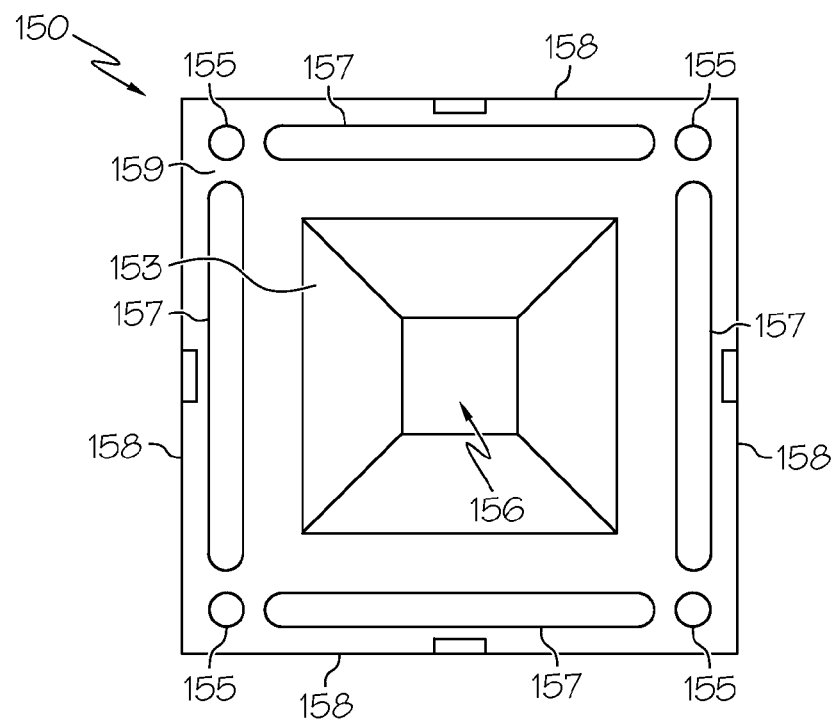
FIG. 10B schematically depicts a bottom view of the jet plate manifold depicted in FIG. 10A.
Figure 10C:
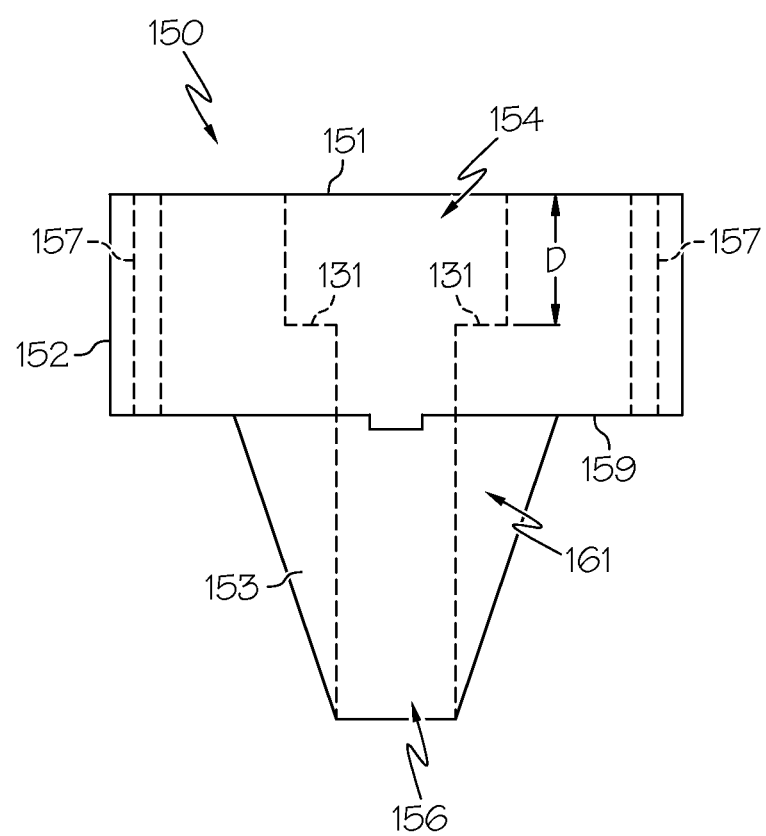
FIG. 10C schematically depicts a side view of the jet plate manifold depicted in FIG. 10A.
Figure 11A:
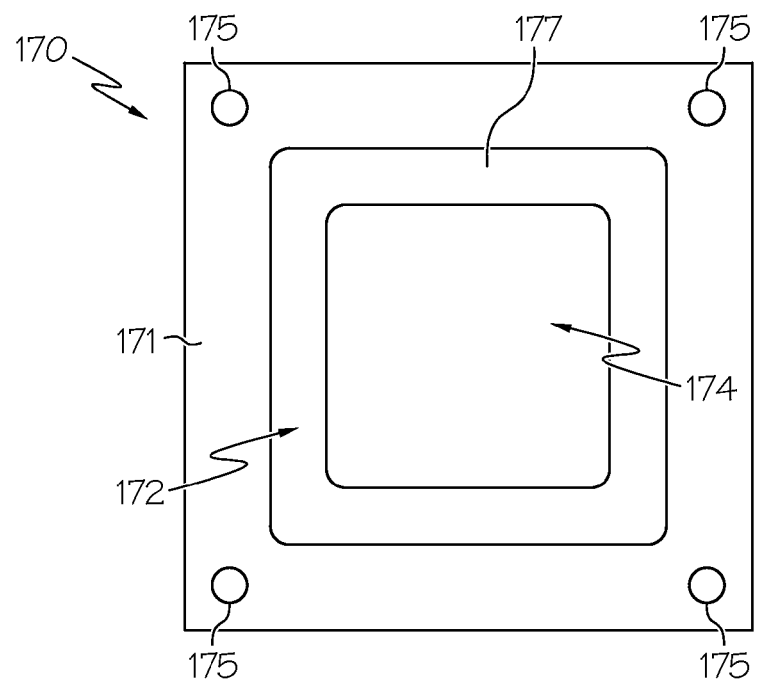
FIG. 11A depicts a top view of the vapor manifold of the cooling apparatus depicted in FIG. 7 according to one or more embodiments described and illustrated herein.
Figure 11B:
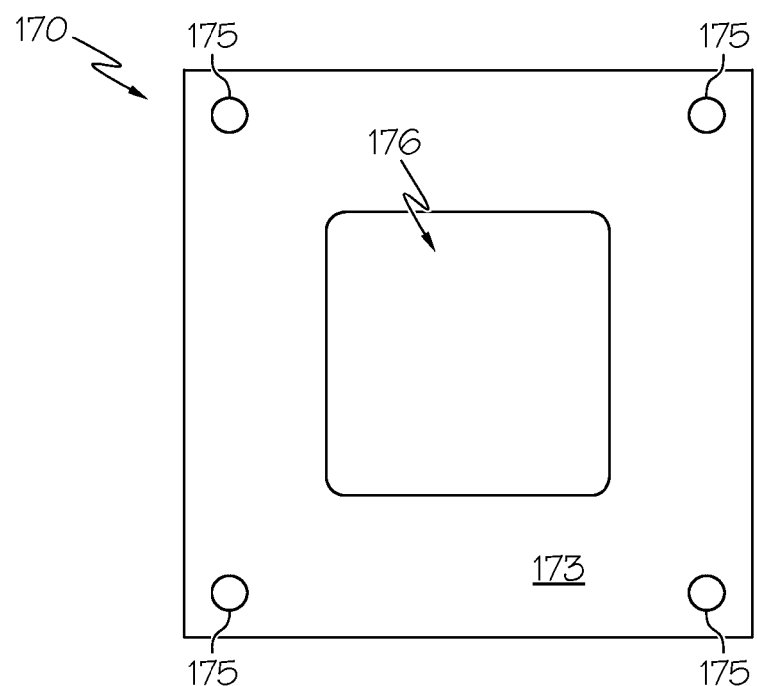
FIG. 11B schematically depicts a bottom view of the vapor manifold depicted in FIG. 11A.
Figure 11C:
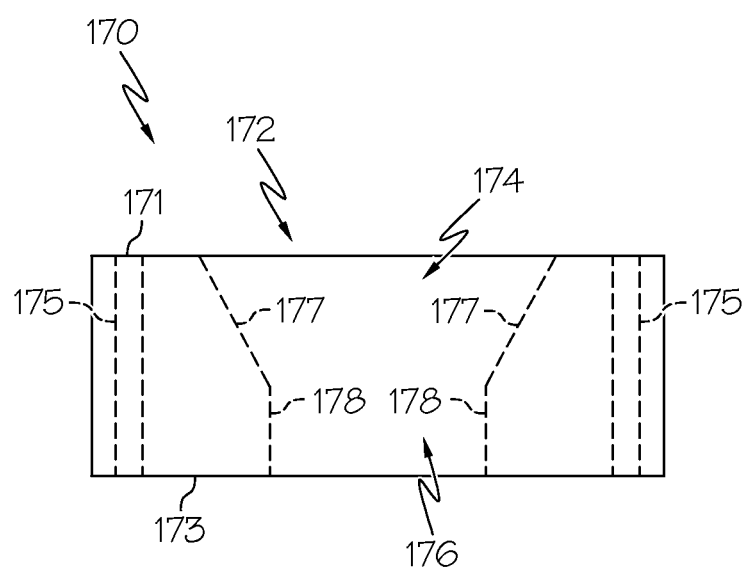
FIG. 11C schematically depicts a side view of the vapor manifold depicted in FIG. 11A.

FIG. 10A is a top view of the jet plate manifold 150 depicted in FIG. 7, while FIGS. 10B and 10C are bottom and side views of the jet plate manifold 150, respectively. Referring now to FIGS. 7 and 10A-10C, the jet plate manifold 150 generally comprises an upper portion 152 defined by four walls 158, and a tapered portion 153 extending from the upper portion 152. Four slot channels 157 are provided within the four walls 158 of the upper portion. The slot channels 157 extend from a first surface 151 to a second surface 159 of the jet plate manifold 150, and are positioned such that they are fluidly coupled to the slot-shaped outlet openings 117 and outlet manifold channels 114a-114d of the inlet-outlet manifold 110 when the jet plate manifold 150 is coupled to the inlet-outlet manifold 110. The jet plate manifold 150 may further comprise a plurality of through-holes 155 for receiving fasteners.

The first surface 151 (i.e., the upper surface) has a first opening 154 that extends to a depth D, and then narrows to a second opening 156, thereby defining a seat 131 (FIG. 10C). The exemplary tapered portion 153 comprises four walls that taper downwardly away from the upper portion 152. As described in more detail below, the tapered portion 153 defines sloped vapor outlet channels 176 through which coolant fluid flows.

Figure 12:
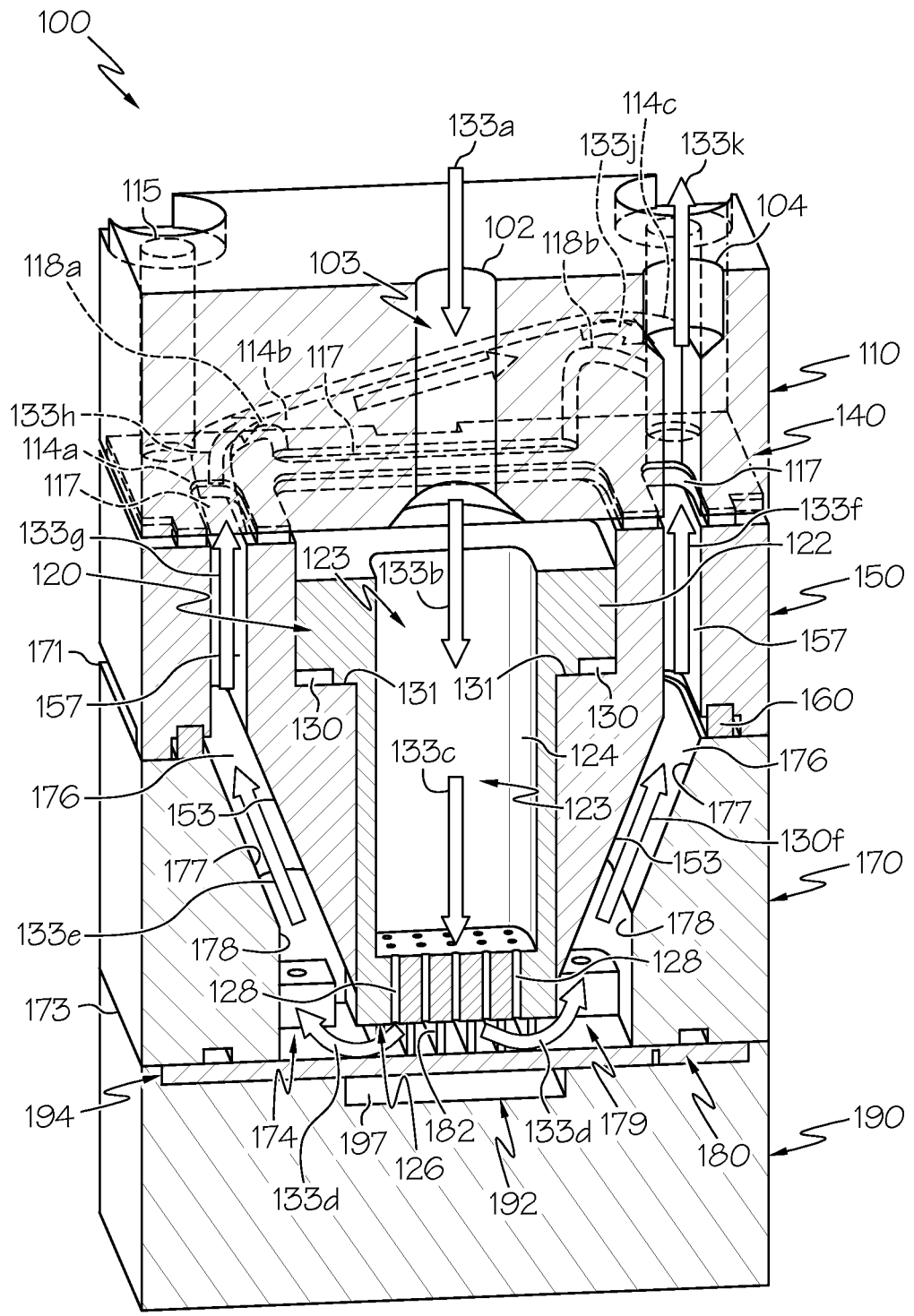
FIG. 12 schematically depicts a cross-sectional, partially transparent perspective view of an assembled cooling apparatus according to one or more embodiments described and illustrated herein.

The first opening 154 and the second opening 156 define a jet plate manifold channel 161 extending from the first surface 151 to the second surface 159. The jet orifice plate 120 is disposed within the jet plate manifold channel 161 of the jet plate manifold 150. As shown in FIG. 12, which is a cross-sectional view of an exemplary cooling apparatus 100, the flange portion 122 of the jet orifice plate 120 is positioned on the seat 131 defined by the transition between the first opening 154 and the second opening 156. In some embodiments, a jet plate gasket 130 may be positioned between the flange portion 122 and the seat 131. The narrow portion 124 of the jet orifice plate 120 is disposed within the second opening 156 and may extend beyond the tapered portion 153, as depicted in FIG. 12.

Referring now to FIGS. 7, 11A-11C and 12, the vapor manifold 170 comprises tapered walls 177 that taper from a first surface 171 toward a second surface 173. The tapered walls 177 define a first opening at 174A at the first surface 171 of the vapor manifold 170. The tapered walls 177 terminate at straight walls 178 that extend to the second surface 173, thereby defining a second opening 174B. The first and second openings 174A, 174B define a vapor manifold opening 172 into which the tapered portion 153 of the jet plate manifold 150 and the narrow portion 124 of the jet orifice plate 120 are disposed. As described in more detail below and depicted in FIG. 12, the tapered walls 177 cooperate with the tapered portion 153 of the jet plate manifold 150 to define the sloped vapor outlet channels 176. The exemplary vapor manifold 170 further comprises through-holes 175, which may be threaded to receive fasteners to couple various components of the cooling apparatus 100 together.

The vapor manifold 170 is coupled to a thermally conductive target surface 180 disposed within an insulation assembly 190, as shown in FIGS. 7 and 12. The target surface 180 also comprises through-holes 185 for receiving fasteners. The target surface 180 may be fabricated from a thermally conductive material, such as copper or aluminum, for example. The target surface 180 comprises a plurality of surface fins 182 that extend from the target surface 180. The surface fins 182 are parallel to the rows (or columns) of jet orifices 125, and orthogonal to the vapor guide channels 127. The surface fins 182 increase the surface area in contact with the coolant fluid, thereby increasing heat transfer. In some embodiments, the surface fins 182 and/or the target surface 180 are rough or porous to maximize a number of nucleation sites for the formation of vapor bubbles. Further, the surface fins 182 assist in directing the coolant fluid within an impingement chamber 179 defined by the target surface 180, the jet orifice plate 120 and the tapered portion 153 of the jet plate manifold.

The insulation assembly 190 is configured to receive the target surface 180. In the illustrated embodiment, the insulation assembly 190 includes a recessed area 194 into which the target surface 180 is disposed. The illustrated insulation assembly 190 further includes a device recess 192 that is configured to accept a heat generating device 197, such as a semiconductor device (see FIG. 12). The target surface 180 is thermally coupled to the heat generating device 197. The insulation assembly 190 may further include a notch 193 that allows electrical connections to pass from the heat generating device 197 out of the cooling apparatus 100. The insulation assembly 190 may also include through-holes or blind bores for receiving fasteners to maintain the various components in an assembled state.

The insulation assembly 190 may be fabricated from any non-electrically conductive material capable of withstanding the high operating temperatures of the heat generating device 197. Exemplary materials include, but are not limited to, solidified polymers (e.g., polyether ether ketone ("PEEK")), ceramic materials (e.g., aluminum nitride), and the like.

Referring specifically now to FIG. 12, a cross-sectional, partially transparent view of an assembled cooling apparatus 100 is schematically depicted. A heat generating device 197 is positioned in a device recess 192 of the insulation assembly 190. The target surface 180 is positioned within the recessed area 194. A second surface 173 of the vapor manifold 170 is coupled to the insulation assembly 190 and the target surface 180.

The jet plate manifold 150 is coupled to the first surface 171 of the vapor manifold 170. In some embodiments, a vapor manifold gasket 160 is positioned between the jet plate manifold 150 and the vapor manifold 170 to prevent coolant fluid from leaking between the two components. The jet plate manifold 150 is arranged with respect to the vapor manifold 170 such that the tapered portion 153 is disposed within the vapor manifold opening 172. The tapered portion 153 of the jet plate manifold 150 is offset with respect to the tapered walls 177 of the vapor manifold 170 such that the tapered portion 153 and the tapered walls 177 define a plurality of sloped vapor outlet channels 176. The sloped vapor outlet channels 176 slope outwardly away from an impingement region (i.e., a region at the surface fins 182) and upwardly toward the fluid inlet 102 (i.e., opposing gravity). The sloped vapor outlet channels 176 are aligned with, and fluidly coupled to, the slot channels 157. As described above, the sloped vapor outlet channels 176 take advantage of the buoyancy of the vapor bubbles to guide them away from the impingement region.

The jet orifice plate 120 is positioned within the jet plate manifold channel 161 such that the jet orifice surface 126 contacts, or nearly contacts, the surface fins 182 of the target surface 180. Additionally, the surface fins 182 may have a geometric configuration that is different from that depicted in FIGS. 7 and 12. In the illustrated embodiment, the rows of jet orifices 125 are aligned with respect to the surface fins 182 such that the impingement jets exiting the jet orifices 125 are between adjacent surface fins 182. Further, the vapor guide channels 127 of the jet orifice surface 126 are orthogonal to the surface fins 182.

The narrow portion 124 of the jet orifice plate 120, the tapered portion 153 of the jet plate manifold 150, and the target surface 180 define an impingement chamber 179 into which the coolant fluid flows after impinging the target surface 180, as described in more detail below.

The inlet-outlet manifold 110 is coupled to the jet plate manifold 150. In some embodiments, a jet plate manifold gasket 140 is positioned between the inlet-outlet manifold 110 and the jet plate manifold 150 to prevent coolant fluid from escaping the cooling apparatus 100. The slot-shaped outlet openings 117 of the inlet-outlet manifold are aligned with the slot channels 157 of the jet plate manifold 150, thereby fluidly coupling the outlet manifold channels 114a-114d of the inlet-outlet manifold 110 to the slot channels 157.

The outlet manifold channels 114a-114d are fluidly coupled to the fluid outlet 104. In the illustrated embodiment, the outlet manifold channel 114c that is closest to the fluid outlet 104 has the largest height, and the outlet manifold channel 114a opposite from the fluid outlet 104 has the smallest height. Each of the outlet manifold channels 114a-114d slope upwardly toward the fluid outlet 104. It is noted that outlet manifold channel 114d is not visible in FIG. 7, and that outlet manifold channel 114d is symmetrically similar to outlet manifold channel 114b. The outlet manifold channels 114a-114d surround the inlet manifold channel 103 near the perimeter of the inlet-outlet manifold 110.

Figure 13:
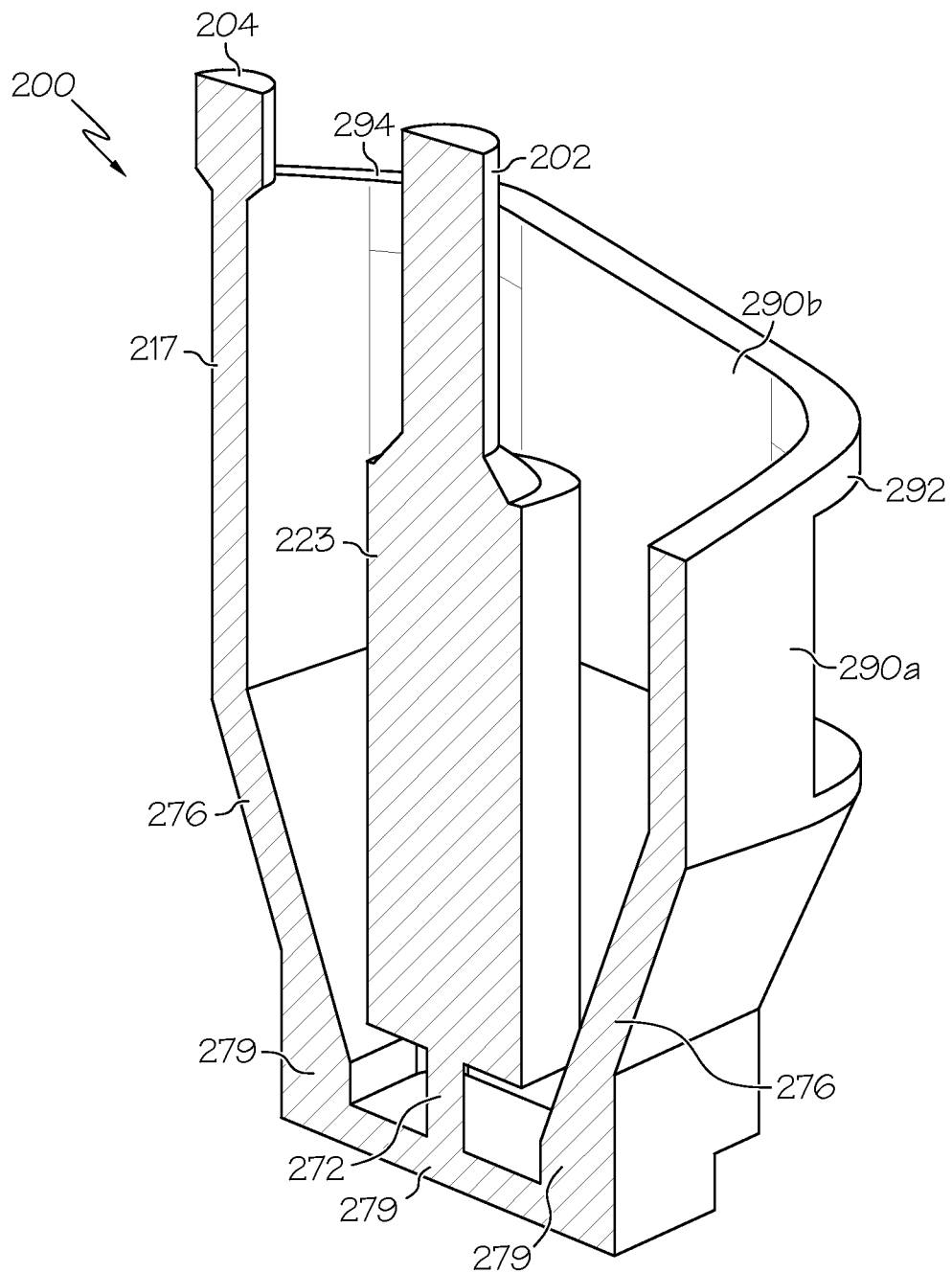
FIG. 13 schematically depicts a fluid domain of coolant fluid flowing within the cooling apparatus depicted in FIG. 12.

Referring now to FIGS. 12 and 13, coolant fluid flow through the cooling apparatus 100 will now be described. FIG. 13 schematically depicts a cross-section of the fluid domain 200 of coolant fluid (in the form of liquid and vapor) flowing through the cooling apparatus 100. Coolant fluid enters the fluid inlet 102 and the inlet manifold channel 103 as indicated by arrow 133a, and fluid region 202 of FIG. 13. The coolant fluid may originate from a coolant fluid reservoir. The coolant fluid flows from the inlet-outlet manifold 110 into the jet channel 123, as indicated by arrows 133b and 133c, as well as fluid region 223 of FIG. 13. The coolant fluid then flows through the jet orifices 125 as an impingement jet between adjacent surface fins 182 (represented generically by fluid region 272). The coolant fluid flows between and around the surface fins 182 toward a perimeter of the impingement chamber 179 as indicated by arrows 133d (fluid region 274 of FIG. 13). Due to the high operating temperature of the heat generating device 197, some of the coolant fluid changes from a liquid to a vapor. Accordingly, vapor bubbles form within the impingement chamber. As described above, the vapor guide channels 127 within the jet orifice surface 126 provide additional volume for the vapor bubbles that form near the surface fins 182. Buoyant forces move the vapor bubbles into the vapor guide channels 127, where they then flow in a direction orthogonal to the coolant fluid flowing between the surface fins 182. The vapor bubbles flow away from the impingement region through the vapor guide channels 127.

Body forces and buoyant forces then direct the coolant fluid (both liquid and vapor bubbles) into the sloped vapor outlet channels 176 as indicated by arrows 133e and 133f (fluid region 276 of FIG. 13). It is noted that coolant fluid flows through all four sloped vapor outlet channels 176, and that only two arrows (arrows 133e, 133f) are depicted for ease of illustration. The sloped vapor outlet channels 176 take advantage of the buoyancy of the vapor bubbles to guide them away from the surface fins 182 and the impingement region.

The coolant fluid then flows from the sloped vapor outlet channels 176 into the slot channels 157 of the jet plate manifold 150 as indicated by arrows 133g and 133f, wherein it flows upward and into the outlet manifold channels 114a-114d of the inlet-outlet manifold 110. Referring to FIG. 13, the coolant fluid flowing within the slot channels 157 and the outlet manifold channels 114a-114d are combined into individual flow regions 290a-290c for ease of illustration. It is noted that a fourth fluid region 290d is not depicted in FIG. 13, and is symmetrically similar to fluid region 290b.

A top portion of each of the fluid regions 290a-290d slope upwardly toward the fluid outlet. Fluid region 290a is the shortest of the four fluid regions 290a-290d, and slopes upwardly toward fluid region 290b and 290d (not shown). Fluid region 290c is the tallest of the four fluid regions 290a-290d and is closest to the fluid outlet, which is indicated by fluid region 204 in FIG. 13. A bridge channel indicated by bridge fluid region 292 fluidly couples fluid region 290a to fluid region 292b. In other words, outlet manifold channels 114a and 114b are fluidly coupled by an internal bridge channel 118a (FIG. 12). Similarly, outlet manifold channels 114a and 114d are fluidly coupled by a bridge channel (not shown) that is symmetrically similar to internal bridge channel 118a. Coolant fluid flowing through internal bridge channel 118a is indicated by arrow 133h in FIG. 12.

Coolant fluid flowing up within outlet manifold channels 114b and 114d through slot channels 157, as well as coolant fluid entering from outlet manifold channel 114a, flows upwardly toward outlet manifold channel 114c as indicated by arrow 133i. Accordingly, FIG. 13 depicts the fluid region 290b that slopes upwardly toward fluid region 290c. Outlet manifold channel 114b is fluidly coupled to outlet manifold channel 114c by an internal bridge channel 118b. Thus, coolant fluid flows from outlet manifold channel 114b into outlet manifold channel 114c through the internal bridge channel 118b as indicated by arrow 133j. FIG. 13 depicts a bridge fluid region 294 that fluidly couples fluid region 290b to fluid region 290c. It is noted that outlet manifold channel 114d (not shown) is also fluidly coupled to outlet manifold channel 114c by an internal bridge channel that is symmetrically similar to internal bridge channel 118b.

Coolant fluid flowing from the slot channel 157 aligned with outlet manifold channel 114c, as well as coolant fluid entering outlet manifold channel from the other outlet manifold channels 114b-114d, flow upwardly toward the fluid outlet 104 as indicated by 133k. The coolant fluid then exits the cooling apparatus through the fluid outlet 104. Coolant fluid within the fluid outlet 104 is depicted as fluid region 204 in the fluid domain 200 of FIG. 13.

It should now be understood that embodiments described herein are configured as cooling apparatuses that cool a heat generating device by jet-impingement and two-phase heat transfer with reduced pressure drop by employing vapor outlet channels between jet orifices in a jet orifice surface. The vapor outlet channels provide additional volume for the vapor bubbles to escape the cooling apparatus, thereby reducing the two-phase pressure drop. In some embodiments, sloped vapor outlet channels are provided that guide vapor bubbles away from an impingement region by taking advantage of the buoyant forces of the vapor bubbles. The sloped vapor outlet channels resolve the inherent pressure build-up associated with the incomplete evacuation of vapor from the cooling apparatus, which causes an increase in the saturation temperature of the coolant fluid and diminishes the effectiveness of heat transfer.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A cooling apparatus comprising:
a fluid inlet channel;
a jet orifice surface comprising:
an array of jet orifices comprising a plurality of jet orifice rows, wherein coolant fluid within the fluid inlet channel flows through the array of jet orifices as impingement jets; and
a plurality of vapor guide channels positioned between the plurality of jet orifice rows and parallel to a first axis such that the jet orifice surface is defined by alternating jet orifice rows and vapor guide channels; and
a target surface comprising a plurality of surface fins extending from a surface of the target surface and parallel to a second axis that is orthogonal to the first axis, wherein the jet orifice surface is positioned proximate the plurality of surface fins;
a coolant fluid chamber; and
a plurality of sloped vapor outlet channels fluidly coupled to the coolant fluid chamber, wherein each sloped vapor outlet channel slopes in a direction that is both away from the jet orifice surface and opposite from a direction of the impingement jets.

2. The cooling apparatus of claim 1, wherein:
the impingement jets of coolant fluid impinge the target surface between adjacent surface fins;
at least a portion of the coolant fluid enters the plurality of vapor guide channels and flows away from an impingement region of the target surface in directions along the first axis; and
at least a portion of the coolant fluid flows away from the impingement region of the target surface between the surface fins in directions along the second axis.

3. The cooling apparatus of claim 1, further comprising an insulation assembly and a heat generating device coupled to the insulation assembly and the target surface.

4. The cooling apparatus of claim 3, wherein the heat generating device is a semiconductor device.

5. A cooling apparatus comprising:
a jet plate manifold, wherein the jet plate manifold is configured to receive a coolant fluid;
a jet orifice surface within the jet plate manifold, the jet orifice surface comprising:
an array of jet orifices comprising a plurality of jet orifice rows, wherein coolant fluid within the fluid inlet channel flows through the array of jet orifices as impingement jets; and
a plurality of vapor guide channels positioned between the plurality of jet orifice rows and parallel to a first axis such that the jet orifice surface is defined by alternating jet orifice rows and vapor guide channels;
a vapor manifold having an opening, wherein the jet plate manifold is disposed within the opening of the vapor manifold such that a plurality of vapor outlet channels is located between the jet plate manifold and the vapor manifold; and
a target surface coupled to the vapor manifold, wherein the impingement jets strike the target surface, and at least some of the coolant fluid changes to a vapor that enters the plurality of vapor guide channels of the jet orifice surface, wherein:
the jet plate manifold comprises a tapered portion and a jet plate manifold opening;
the vapor manifold comprises a plurality of tapered walls defining the opening; and
the tapered portion of the jet plate manifold is disposed within the opening of the vapor manifold such that the plurality of vapor outlet channels are located between the plurality of tapered walls of the vapor manifold and the tapered portion of the jet plate manifold.

6. The cooling apparatus of claim 5, wherein the target surface comprises a plurality of surface fins extending from a surface of the target surface and parallel to a second axis that is orthogonal to the first axis.

7. The cooling apparatus of claim 6, wherein:
the jet orifice surface is positioned proximate the plurality of surface fins;
the impingement jets of coolant fluid impinge the target surface between adjacent surface fins;
at least a portion of the coolant fluid enters the plurality of vapor guide channels and flows away from an impingement region of the target surface in directions along the first axis;
at least a portion of the coolant fluid flows away from the impingement region of the target surface between the surface fins in directions along the second axis; and
the coolant fluid flows into the plurality of vapor outlet channels and exits the cooling apparatus.

8. The cooling apparatus of claim 5, wherein:
the cooling apparatus further comprises a jet orifice plate comprising:
a flange portion; and
an opening on a surface of the flange portion, wherein the jet orifice surface is provided on the jet orifice plate opposite the flange portion such that a jet channel is located between the opening and the jet orifice surface;
the jet plate manifold comprises a jet plate manifold opening and a seat within the jet plate manifold opening; and
the jet orifice plate is disposed within the jet plate manifold opening such that the flange portion is positioned on the seat.

9. The cooling apparatus of claim 5, wherein the plurality of tapered walls is substantially parallel to the tapered portion of the jet plate manifold.

10. The cooling apparatus of claim 5, wherein:
the tapered portion of the jet plate manifold extends from an upper portion having a plurality of walls;
a plurality of slot channels are disposed within the plurality of walls of the upper portion; and
the plurality of slot channels are fluidly coupled to the plurality of vapor outlet channels.

11. The cooling apparatus of claim 10, further comprising an inlet-outlet manifold coupled to the jet plate manifold, the inlet-outlet manifold comprising:
a fluid inlet;
an inlet manifold channel fluidly coupled to the fluid inlet and the jet plate manifold opening;
a plurality of outlet manifold channels fluidly coupled to the plurality of slot channels of the jet plate manifold; and
a fluid outlet fluidly coupled to the plurality of outlet manifold channels.

12. The cooling apparatus of claim 11, wherein:
the plurality of outlet manifold channels is defined by a first outlet manifold channel, a second outlet manifold channel, a third outlet manifold channel, and a fourth outlet manifold channel, wherein the first through fourth outlet manifold channels are fluidly coupled;
the fluid outlet is positioned above the first outlet manifold channel, and the fourth outlet manifold channel is opposite from the first outlet manifold channel;
the fourth outlet manifold channel has a height that is shorter than the first outlet manifold channel; and
the second outlet manifold channel and the third outlet manifold channel slope upwardly toward the first outlet manifold channel and the fluid outlet.

13. The cooling apparatus of claim 5, further comprising an insulation assembly and a semiconductor device coupled to the insulation assembly and the target surface.

14. A cooling apparatus comprising:
an inlet-outlet manifold, the inlet-outlet manifold comprising:
a fluid inlet configured to receive a coolant fluid;
an inlet manifold channel fluidly coupled to the fluid inlet;
a plurality of outlet manifold channels; and
a fluid outlet fluidly coupled to the plurality of outlet manifold channels;
a jet plate manifold coupled to the inlet-outlet manifold, the jet plate manifold comprising:
an upper portion comprising a plurality of walls;
a plurality of slot channels within the plurality of walls, wherein the plurality of slot channels are fluidly coupled to the plurality of outlet manifold channels;
a tapered portion extending from the upper portion;
a jet plate manifold opening extending through the upper portion and the tapered portion wherein the jet plate manifold opening is fluidly coupled to the inlet manifold channel; and
a seat within the jet plate manifold opening;
a jet orifice plate disposed within the jet plate manifold opening, the jet orifice plate comprising:
a flange portion, wherein the jet orifice plate is disposed within the jet plate manifold opening such that the flange portion is positioned on the seat; and
a jet orifice surface opposite from the flange portion, the jet orifice surface comprising:
an array of jet orifices comprising a plurality of jet orifice rows;
a plurality of vapor guide channels positioned between the plurality of jet orifice rows and parallel to a first axis such that the jet orifice surface is defined by alternating jet orifice rows and vapor guide channels; and
a jet channel, wherein the jet channel is fluidly coupled to the inlet manifold channel, and the coolant fluid flows through the array of jet orifices as impingement jets;
a vapor manifold comprising a plurality of tapered walls defining an opening, wherein:
the tapered portion of the jet plate manifold is disposed within the opening of the vapor manifold such that a plurality of vapor outlet channels are located between the plurality of tapered walls of the vapor manifold and the tapered portion of the jet plate manifold; and
each vapor outlet channel of the plurality of vapor outlet channels slopes in a direction that is both away from the jet orifice plate and opposite from a direction of the impingement jets; and
a target surface coupled to the vapor manifold, wherein at least some of the coolant fluid changes to a vapor that enters the plurality of vapor guide channels of the jet orifice surface.

15. The cooling apparatus of claim 14, wherein:
the target surface comprises a plurality of surface fins extending from a surface of the target surface and parallel to a second axis that is orthogonal to the first axis;
the jet orifice surface is positioned proximate the plurality of surface fins;
the impingement jets of coolant fluid impinge the target surface between adjacent surface fins;
at least a portion of the coolant fluid enters the plurality of vapor guide channels and flows away from an impingement region of the target surface in directions along the first axis;
at least a portion of the coolant fluid flows away from the impingement region of the target surface between the surface fins in directions along the second axis; and
the coolant fluid flows into the plurality of vapor outlet channels and exits the cooling apparatus.

16. The cooling apparatus of claim 14, further comprising an insulation assembly and a semiconductor device coupled to the insulation assembly and the target surface.

* * * * *